(12) United States Patent
Shimizu et al.

(10) Patent No.: US 8,534,857 B2
(45) Date of Patent: Sep. 17, 2013

(54) BACKLIGHT APPARATUS, LIGHT SOURCE FOR BACKLIGHT APPARATUS, AND DISPLAY APPARATUS USING THE SAME

(75) Inventors: Masanori Shimizu, Kyoto (JP); Yoko Matsubayashi, Osaka (JP); Hiroshi Yagi, Osaka (JP)

(73) Assignee: Panasonic Corporation, Osaka (JP)

(*) Notice: Subject to any disclaimer, the term of this patent is extended or adjusted under 35 U.S.C. 154(b) by 430 days.

(21) Appl. No.: 12/911,553

(22) Filed: Oct. 25, 2010

(65) Prior Publication Data

US 2011/0096530 A1  Apr. 28, 2011

(30) Foreign Application Priority Data

Oct. 26, 2009  (JP) ................. 2009-245518

(51) Int. Cl.
*F21K 2/00*  (2006.01)
*H05B 33/00*  (2006.01)
*F21K 2/08*  (2006.01)

(52) U.S. Cl.
CPC ...................... *F21K 2/08* (2013.01)
USPC ............ 362/97.2; 362/97.3; 362/231; 362/84

(58) Field of Classification Search
None
See application file for complete search history.

(56) References Cited

U.S. PATENT DOCUMENTS 7,404,652 B2 * 7/2008 Ng et al. .................. 362/231
2010/0002413 A1  1/2010 Igarashi et al.

FOREIGN PATENT DOCUMENTS

WO  2008/056713  5/2008

* cited by examiner

*Primary Examiner* — Sharon Payne (57) ABSTRACT

A backlight apparatus comprises a light source that is composed of a combination of a blue light emitting device, a green light emitting phosphor, and a red light emitting phosphor. The blue light emitting device has a peak intensity of a light emitting spectrum 3 to 19 times as high as the green light emitting phosphor.

13 Claims, 11 Drawing Sheets

|  | x | y | Peak ratio |
|---:|---:|---:|---:|
| Example 1 | 0.26 | 0.25 | 3.0 |
| Example 2 | 0.26 | 0.21 | 4.4 |
| Example 3 | 0.26 | 0.20 | 4.9 |
| Example 4 | 0.26 | 0.17 | 7.2 |
| Example 5 | 0.25 | 0.25 | 3.0 |
| Example 6 | 0.30 | 0.25 | 3.3 |
| Example 7 | 0.30 | 0.22 | 4.6 |
| Example 8 | 0.28 | 0.19 | 6.1 |
| Example 9 | 0.24 | 0.14 | 10 |
| Example 10 | 0.22 | 0.12 | 12 |
| Example 11 | 0.20 | 0.09 | 19 |
| Comparative example 1 | 0.33 | 0.33 | 1.7 |
| Comparative example 2 | 0.30 | 0.30 | 2.1 |
| Comparative example 3 | 0.26 | 0.15 | 10 |
| Comparative example 4 | 0.26 | 0.10 | 60 |

DCI area ratio 75%

| x | 0.18 | 0.20 | 0.22 | 0.24 | 0.26 |
|---|------|------|------|------|------|
| y | 0.14 | 0.21 | 0.25 | 0.27 | 0.28 |

DCI area ratio 80%

| x | 0.18 | 0.20 | 0.22 | 0.24 | 0.26 |
|---|------|------|------|------|------|
| y | 0.13 | 0.19 | 0.23 | 0.25 | 0.26 |

DCI area ratio 85%

| x | 0.18 | 0.20 | 0.22 | 0.24 | 0.26 | 0.38 |
|---|------|------|------|------|------|------|
| y | 0.12 | 0.18 | 0.21 | 0.22 | 0.23 | 0.25 |

DCI area ratio 90%

| x | 0.18 | 0.20 | 0.22 | 0.24 | 0.26 | 0.28 | 0.30 | 0.32 | 0.33 | 0.34 | 0.36 | 0.36 | 0.38 | 0.36 | 0.34 | 0.33 | 0.32 |
|---|------|------|------|------|------|------|------|------|------|------|------|------|------|------|------|------|------|
| y | 0.11 | 0.16 | 0.19 | 0.20 | 0.21 | 0.22 | 0.22 | 0.22 | 0.22 | 0.22 | 0.22 | 0.21 | 0.18 | 0.16 | 0.15 | 0.15 | |

DCI area ratio 95%

| x | 0.18 | 0.20 | 0.22 | 0.24 | 0.26 | 0.28 | 0.30 | 0.32 | 0.32 | 0.30 |
|---|------|------|------|------|------|------|------|------|------|------|
| y | 0.10 | 0.14 | 0.16 | 0.18 | 0.18 | 0.19 | 0.19 | 0.16 | 0.14 | |

DCI area ratio 100%

| x | 0.18 | 0.20 | 0.22 | 0.24 | 0.26 | 0.27 |
|---|------|------|------|------|------|------|
| y | 0.09 | 0.12 | 0.14 | 0.15 | 0.15 | 0.14 |

DCI area ratio 105%

| x | 0.20 |
|---|------|
| y | 0.09 |

BACKLIGHT APPARATUS, LIGHT SOURCE FOR BACKLIGHT APPARATUS, AND DISPLAY APPARATUS USING THE SAME

BACKGROUND OF THE INVENTION (1) Field of the Invention

The present invention relates to a backlight apparatus for use in a display apparatus such as a liquid crystal display and a light source for the backlight apparatus, and particularly to an art of improving color reproducibility of the display apparatus.

(2) Related Art

Recently, there has been proposed to adopt a light emitting device such as an LED instead of a cold cathode fluorescent lamp, as a light source for a backlight apparatus for use in a liquid crystal display apparatus. A white LED is generally composed of a combination of a blue LED and a yellow light emitting phosphor. However, in consideration of color reproducibility, it is preferred that a white LED is composed of a combination of a blue LED, a green light emitting phosphor, and a red light emitting phosphor. Patent Literature 1 discloses a liquid crystal display apparatus having the structure in which a white LED is composed of a combination of a blue LED, a green light emitting phosphor, and a red light emitting phosphor, and red light has a particularly improved color reproducibility. The Patent Literature 1 also discloses that a mixture ratio of a green light emitting phosphor and a red light emitting phosphor is adjusted to constitute a white LED, thereby obtaining white light.

Patent literature 1 WO2008/056713

SUMMARY OF THE INVENTION

However, as a result of research and development, the present inventors proved that adoption of a conventional white LED does not improve color reproducibility of a display apparatus as high as expected.

In view of this, the present invention aims to provide a backlight apparatus capable of improving color reproducibility of a display apparatus compared with conventional ones and a display apparatus using the backlight apparatus.

The present invention provides a backlight apparatus having a light source, the light source comprising: a blue light emitting device that emits blue light; a green light emitting phosphor that absorbs part of the blue light to emit green light; and a red light emitting phosphor that absorbs at least one of part of the blue light and part of the green light to emit red light, wherein the blue light emitting device has a peak intensity of a light emitting spectrum 3 to 19 times as high as the green light emitting phosphor.

As an evaluation index for color reproducibility of a display apparatus, the DCI (Digital Cinema Initiative) area ratio and the sRGB area ratio are employed, for example. In the process of product development, it is not practical to experimentally produce various types of light sources to evaluate the color reproducibility. Usually, simulation is performed to reduce the number of candidates for experimental product to several pieces. According to the simulation, firstly, a light emission spectrum of a light source is calculated based on a blue light emitting device and a mixture ratio of a green light emitting phosphor and a red light emitting phosphor, and so on. Then, an index value of color reproducibility of the display apparatus is calculated based on the light emission spectrum, a transmission spectrum of a liquid crystal panel including a color filter, and a transmission spectrum of an optical material.

In the process of product development, the present inventors found that actual measurement results of a light emission spectrum of a light source differ from simulation results of that with a particular trend. The particular trend specifically means that a valley between a peak of blue light and a peak of green light in the actual measurement results is shallower than that in the simulation results. If the valley between the peaks is lower than expected, color separation between the blue light and the green light is accordingly insufficient. As a result, it is speculated that the color reproducibility of the display apparatus is lower than expected.

In view of this, according to an aspect of the present invention, the blue light has a peak intensity 3 to 19 times as high as the green light. This peak intensity ratio of the blue light to the green light is higher than that in the structure of a conventional white LED (approximately twice). This structure according to the embodiment can improve the color reproducibility of display apparatuses, compared with conventional arts.

Furthermore, the present inventors found that since a green light emitting phosphor and a red light emitting phosphor, which are excited by a blue light emitting device, each have in principle an absorption band in a visible light band, a valley between a peak of green light and a peak of red light tends to be shallower than expected and a dominant wavelength of each of the green light and the red light tends to vary.

In conventional attempt at optimization of spectral distribution by only performing simulations, these trends have been overlooked as simulation errors. With the finding of these trends, the present invention aims to correct the trends to realize a more preferable display apparatus.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawing:

FIG. 11 shows that actual measurement results of a light emission spectrum of a light source differ from simulation results of that.

DESCRIPTION OF THE PREFERRED EMBODIMENTS

Figure 1:
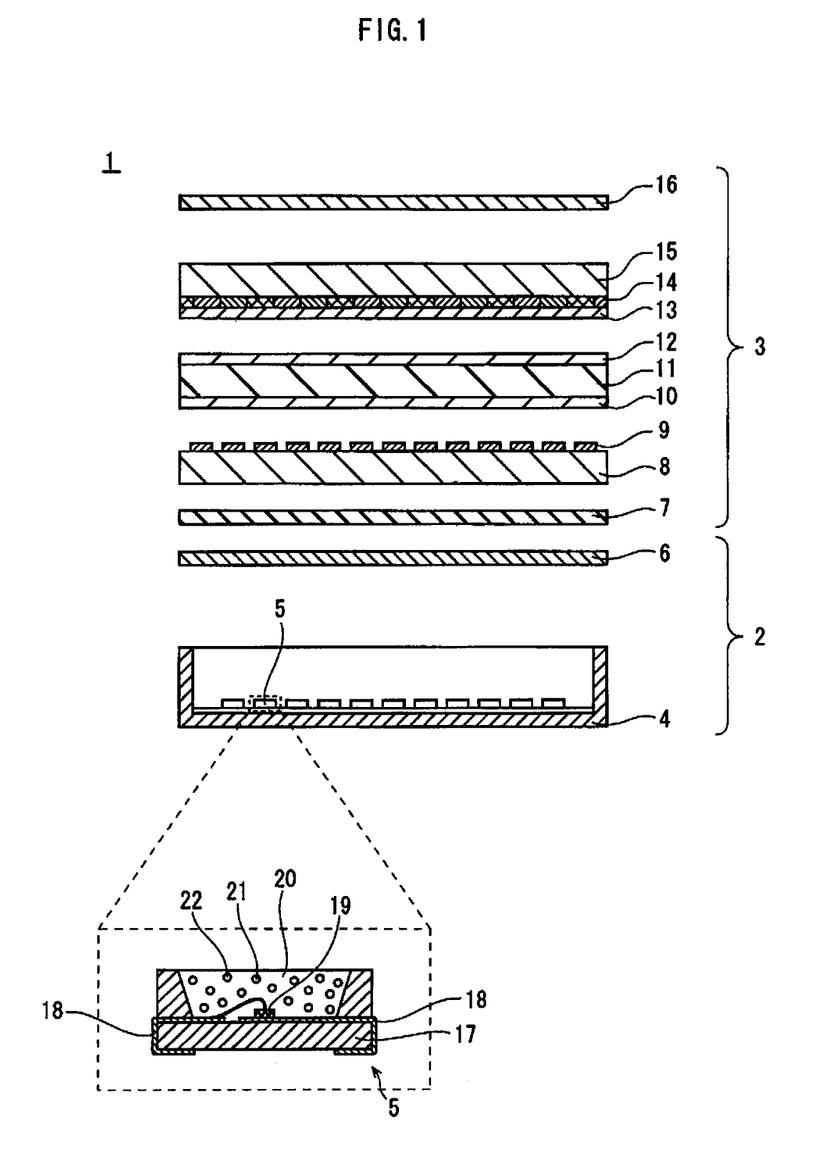
FIG. 1 schematically shows a structure of a display apparatus relating to an embodiment of the present invention.

The following describes an embodiment of the present invention with reference to the drawings.
<Structure>
FIG. 1 schematically shows a structure of a display apparatus relating to the embodiment of the present invention.

The display apparatus 1 includes a backlight apparatus 2 and a liquid crystal panel apparatus 3. The backlight apparatus 2 includes a housing 4, a light source 5, and a diffusion sheet 6. The liquid crystal panel apparatus 3 includes a polarization plate 7, a TFT (Thin Film Transistor) substrate 8, an electrode 9, a light distribution film 10, a liquid crystal layer 11, a light distribution film 12, an electrode 13, a color filter 14, a glass substrate 15, and a polarization plate 16.

The light source 5 includes a package 17, an external lead 18, a blue LED 19 as blue light emitting device, a translucent resin 20, a green light emitting phosphor 21, and a red light emitting phosphor 22. The green light emitting phosphor 21 and the red light emitting phosphor 22 are diffused in the translucent resin 20. Part of blue light emitted from the blue LED 19 is converted into green light by the green light emitting phosphor 21, and part of the blue light and part of the green light are converted into red light by the red light emitting phosphor 22. As a result, light, which is composed of a mixture of the blue, green, and red light, is emitted from the light source 5.

The diffusion sheet 6 leads light, which has been emitted from the light source 5, uniformly to a surface of the liquid crystal panel apparatus 3. The polarization plates 7 and 16 each cause light to vibrate in a particular direction. The TFT substrate 8 and the electrodes 9 and 13 each change inclination of liquid crystal molecules included in the liquid crystal layer 11 for each pixel. The color filter 14 includes blue, green, and red filters for each pixel. The color filter 14 transmits, with respect to light emitted from the light source 5 that has passed through the liquid crystal layer 11, only light of color determined for each pixel.

Note that a person skilled in the art can easily recognize that there are various available types of optical sheets.

In the present embodiment, commercially available materials may be adopted as the blue LED 19, the green light emitting phosphor 21, and the red light emitting phosphor 22 that constitute the light source 5. Specifically, as the blue LED, a material having a nitride light emitting layer may be employed, for example. As the green light emitting phosphor, it may be possible to employ a material having a nitride as a host material, a material having a silicate as a host material, and a material having a garnet structure, for example. As the red light emitting phosphor, it may be possible to employ a material having a nitride as a host material, for example. Also, the blue LED 19 has a peak wavelength of a light emission spectrum in a range of 450 [nm] to 460 [nm], and has a half width of a peak in a range of 15 [nm] to 30 [nm]. The green light emitting phosphor 21 has a peak wavelength of a light emission spectrum in a range of 520 [nm] to 545 [nm], and has a half width of a peak in a range of 50 [nm] to 100 [nm]. The red light emitting phosphor has a peak wavelength of a light emission spectrum in a range of 620 [nm] to 660 [nm], and has a half width of a peak in a range of 50 [nm] to 100 [nm].

In the present embodiment, in order to increase the color reproducibility of the display apparatus 1, the light emission spectrum and the chromaticity of the light source 5 are each determined so as to fall in an appropriate range. Specifically, in the light emission spectrum of the light source 5, a ratio of a peak intensity of blue light to a peak intensity of green light (hereinafter "blue/green ratio") is set so as to fall within a range of 3 to 16.

As described above, by setting the peak intensity of green light enough lower than the peak intensity of blue light, it is possible to increase the color purity of the blue light, thereby improving the color reproducibility of the display apparatus. This is for the following reasons.

As shown later in FIG. 9B, there is an overlapping region between blue light and green light in a transmission spectrum of the liquid crystal panel apparatus. Also, a light emission spectrum of a phosphor has a peak width greater than a light emission spectrum of an LED has. Accordingly, a blue color filter transmits part of light emitted from a green light emitting phosphor in addition to light emitted from a blue LED. This causes the decrease of the color purity of blue light. In view of this cause, the peak intensity of green light is set to sufficiently lower than the peak intensity of blue light, such that the ratio of light emitted from the green light emitting phosphor to light emitted from the blue LED in the overlapping region decreases, thereby improving the color purity of the blue light.

Also, the chromaticity (x,y) of the light source 5 on the CIE chromaticity diagram is adjusted so as to satisfy the following relational expressions. It is possible to appropriately adjust the light emission spectrum and the chromaticity by adjusting a mixture amount of the green light emitting phosphor 21 and the red light emitting phosphor 22, for example.

$$0.09 \leq y \leq 0.26 \tag{1}$$

$$y \leq 2.5x - 0.37 \tag{2}$$

$$y \geq 1.25x - 0.16 \tag{3}$$

Satisfaction of the above relational expressions (1) to (3) can suppress the decrease of the light extraction efficiency.

In addition to the above relational expressions (1) to (3), it is preferable that the following relational expression is satisfied by the chromaticity (x,y) of the light source on the CIE chromaticity diagram.

$$y < 1.594x - 0.230 \tag{4}$$

The border line for the relational expression (4) is represented by a line roughly connecting the chromaticity of a blue LED and the chromaticity of a yellow light emitting phosphor. A chromaticity of conventional white LED or cold cathode fluorescent lamp is distributed in an upper left direction on the xy chromaticity coordinates (value x is smaller and value y is greater), compared with the chromaticity represented by the border line for the relational expression (4). By further satisfying the relational expression (4), it is possible to realize a light source having a chromaticity distributed in a lower right direction on the xy chromaticity coordinates (value x is greater and value y is smaller), compared with conventional ones. The realization of a light source having such a chromaticity is performed only by using the green light emitting phosphor and the red light emitting phosphor instead of the yellow light emitting phosphor. By adopting such a light source, it is possible to set a color gamut reproducible by a display apparatus to a range, which has been unreproducible based on conventional arts, and furthermore to increase the color gamut.

Also, the satisfaction of the relational expressions (1) to (3) can suppress the decrease of the light extraction efficiency. It is more preferable that the peak intensity of the green light falls within a range of plus or minus of 30% of the peak intensity of the red light.

Furthermore, it is preferable that the red light has a peak intensity higher than the green light has. It is more preferable that the red light has a peak intensity 1.05 to 1.1 times as high as the green light. This improves the color purity of the red light, thereby improving the color reproducibility of the display apparatus. This is for the following reasons.

As shown later in FIG. 9B, in the transmission spectrum of the liquid crystal panel apparatus, there is an overlapping region between green light and red light, in addition to the overlapping region between blue light and the green light. Accordingly, a green color filter transmits part of light emitted from a red light emitting phosphor in addition to light emitted from a green light emitting phosphor. On the other hand, a red color filter transmits part of light emitted from the green light emitting phosphor in addition to light emitted from the red light emitting phosphor. This causes the decrease of the color purity of the green light and the red light. Here, the transmission spectrum of the green and red color filters is focused on. According to the transmission spectrum of the red color filter, while the transmissivity decreases at a wavelength shorter than the peak wavelength (at approximately 625 nm in this example), the transmissivity does not decrease so much at a wavelength longer than the peak wavelength. As a result, by simply setting the peak intensity of red light slightly higher than the peak intensity of green light in light emitted from the light source, it is possible to increase the ratio of light emitted from the red light emitting phosphor to light emitted from the green light emitting phosphor in light transmitted by the red color filter. Since a commercially practical red light emitting phosphor has a large half width in a light emission spectrum, there occurs a trend that light emission at a wavelength longer than a light emission peak contributes to improvement of color purity of red light which has been transmitted through a red color filter.

Also, this trend is also due to that the spectral transmission characteristics of the red color filter are higher in a large range at a longer wavelength. The trend is achievable by mutual utilization of the spectral characteristics of the light source and the spectral characteristics of the liquid crystal panel apparatus.

Conversely, suppose a case where light emission from a green light emitting phosphor is increased. In such a case, a commercially practical green light emitting phosphor also has a large half width in a light emission spectrum, and this increases the crosstalk to blue light and red light which have been transmitted through blue and red color filters respectively. As a result, the color purity decreases.

The present inventors found this relationship. It is possible to achieve a more preferable result by generally setting the light emission peak intensity of the red light emitting phosphor so as to be equal to or higher than the light emission peak intensity of the green light emitting phosphor. Accordingly, by setting the peak intensity of red light to higher than the peak intensity of green light, it is possible to improve the color purity of red light.

Furthermore, by arbitrarily combining contour lines for the DCI area ratio shown later in FIG. 6 and various parameters for chromaticity settings, it is possible to manufacture a light source that can realize color reproduction at a predetermined color gamut. Also, by combining a contour line of 80% to 85%, it is possible to realize color reproduction higher compared with conventional cold cathode fluorescent lamps. Furthermore, by combining a contour line of 90% to 95%, it is possible to realize color reproduction for which is more clearly perceivable.

EXAMPLES

The following describes examples and comparative examples relating to the present embodiment.

Figure 2A:
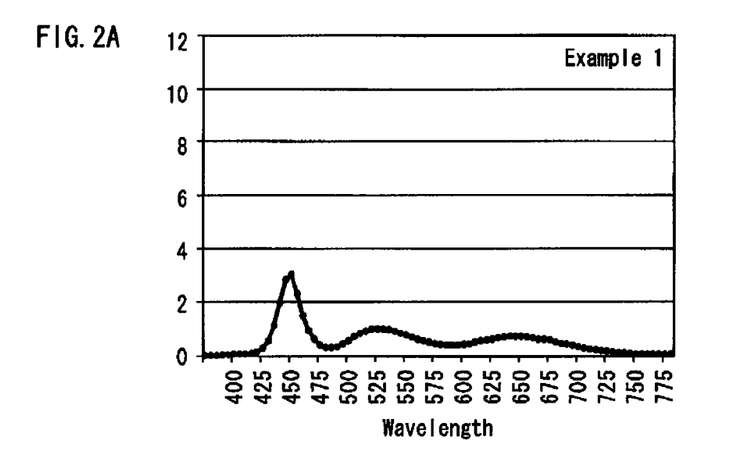
FIGS. 2A, 2B, and 2C show a light emission spectrum of a light source relating to Examples 1 to 3, respectively.
Figure 2B:
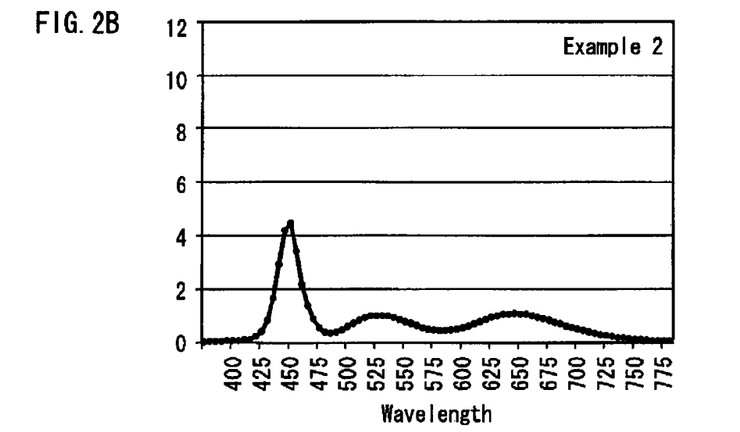
Figure 2C:
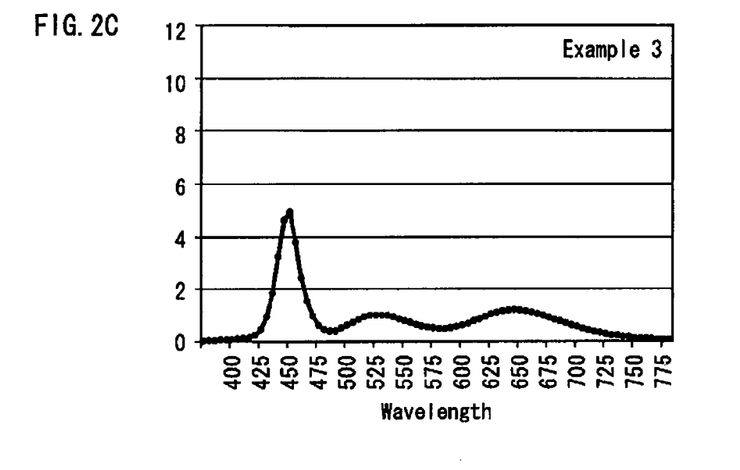
Figure 3A:
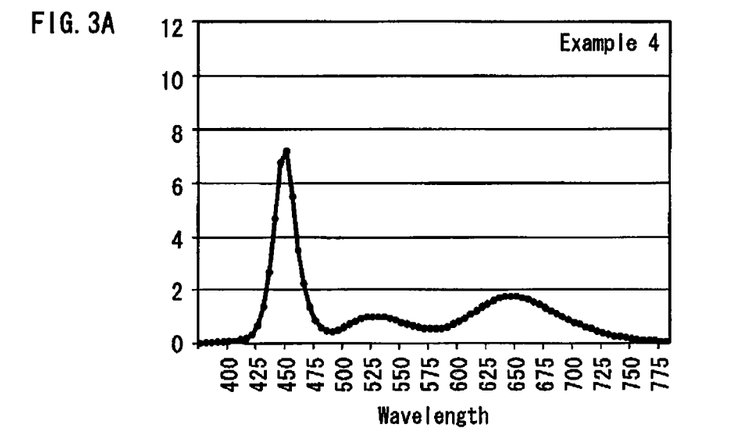
FIGS. 3A, 3B, and 3C show a light emission spectrum of a light source relating to Examples 4 to 6, respectively.
Figure 3B:
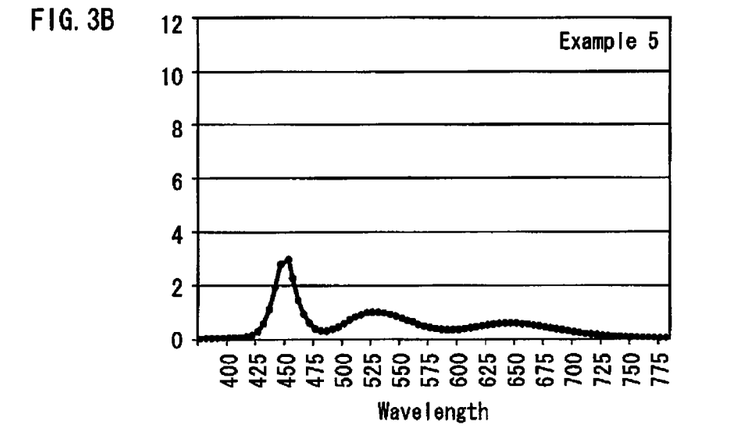
Figure 3C:
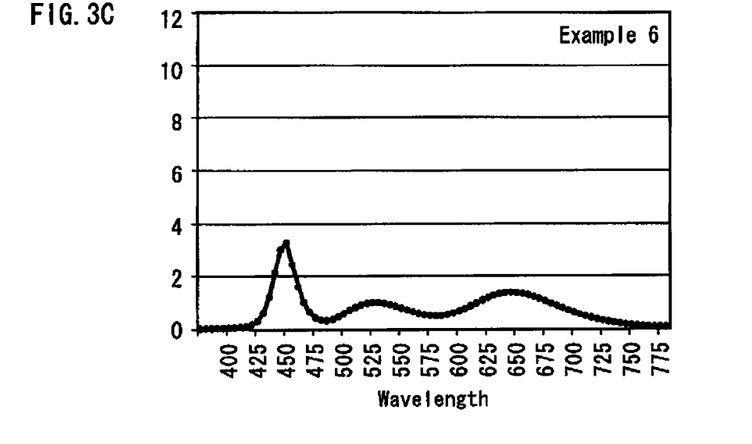
Figure 4A:
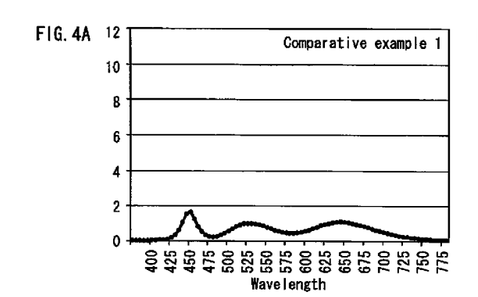
FIGS. 4A, 4B, 4C, and 4D show a light emission spectrum of a light source relating to Comparative Examples 1 to 4, respectively.
Figure 4B:
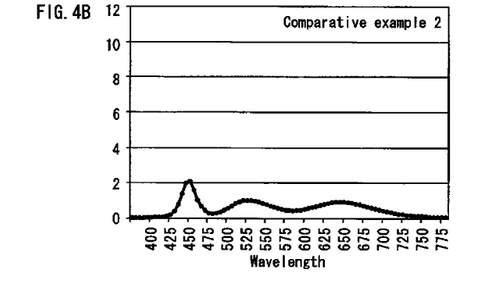
Figure 4C:
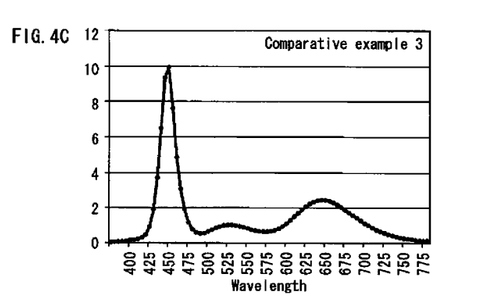
Figure 4D:
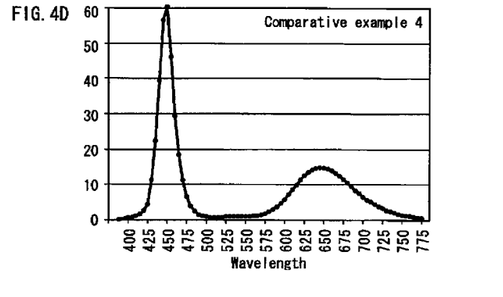

FIGS. 2A, 2B, and 2C show a light emission spectrum of a light source relating to Examples 1 to 3, respectively. FIGS. 3A, 3B, and 3C show a light emission spectrum of a light source relating to Examples 4 to 6, respectively. FIGS. 4A, 4B, 4C, and 4D show a light emission spectrum of a light source relating to Comparative Examples 1 to 4, respectively. These figures shows part of the simulations results obtained by the present inventors.

According to the Example 1, blue light has a peak at a wavelength of 450 [nm], green light has a peak at a wavelength of 525 [nm], and red light has a peak at a wavelength of 650 [nm]. According to the Example 1, the blue/green ratio in the light emission spectrum is 3.0. FIGS. 2A to 2C, 3A to 3C, and 4A to 4C show that the peak intensity of green light has a value of 1 in the Examples and the Comparative Examples, except for the Comparative Example 4. Accordingly, the numerical value of the peak intensity of blue light is equivalent to the blue/green ratio in FIGS. 2A to 2C, 3A to 3C, and 4A to 4C.

Figure 5:
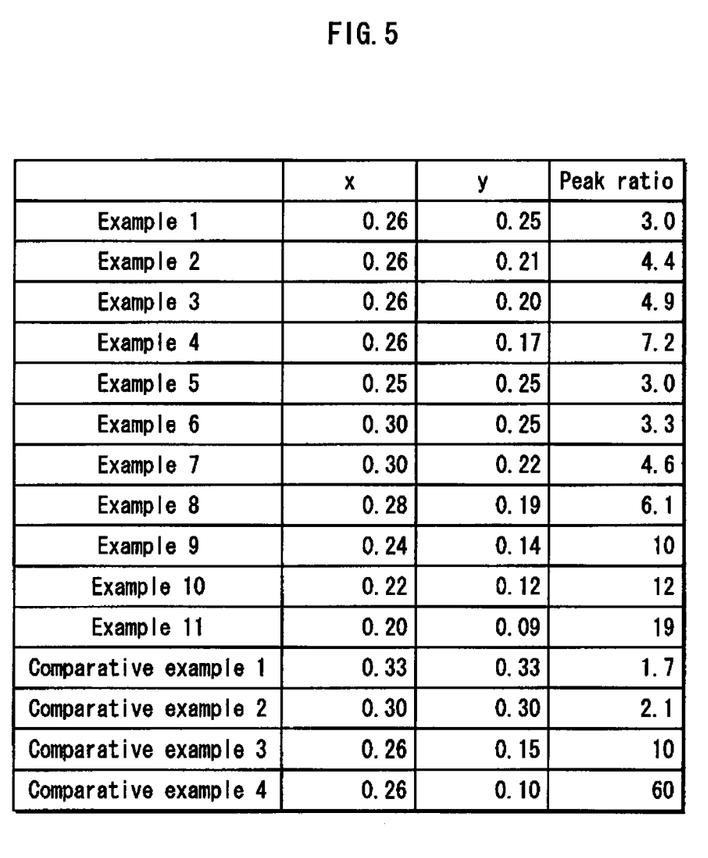
FIG. 5 shows a chromaticity and a peak intensity of blue light to a peak intensity of green light (peak ratio), with respect to a light source relating to each of the Examples 1 to 11 and the Comparative Examples 1 to 4.

FIG. 5 shows the chromaticity and the blue/green ratio with respect to a light source relating to each of the Examples 1 to 11 and the Comparative Examples 1 to 4. Also, FIG. 6 shows the CIE chromaticity diagram on which the chromaticity relating to each of the Examples 1 to 11 and the Comparative Examples 1 to 4 has been plotted.

Figure 6:
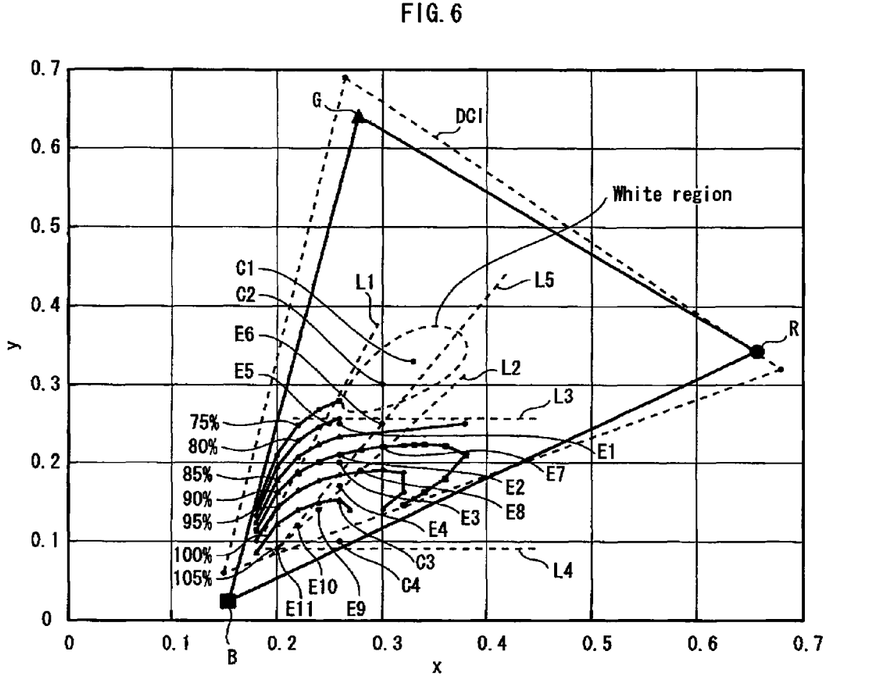
FIG. 6 is a CIE chromaticity diagram.

A "white region" shown in FIG. 6 is a white region defined by the JIS Z8110.

A "DCI" shown in FIG. 6 is an RGB chromaticity triangle defined by the DCI (Digital Cinema Initiative). In the DCI, the chromaticities of R(0.68,0.32), G(0.265,0.69), and B(0.15,0.06) are defined.

In FIG. 6, a sign "B" represents the chromaticity of light emitted from only a blue LED used in this simulation. Similarly, a sign "G" represents the chromaticity of light emitted from only a green light emitting phosphor used in this simulation, and a sign "R" represents the chromaticity of light emitted from a red light emitting phosphor used in this simulation. Specifically, R(0.66,0.34), G(0.28,0.64), and B(0.15, 0.023) forms the RGB chromaticity triangle. This triangle represents the theoretical limit of color representation that can be performed by the display apparatus.

Figure 7:
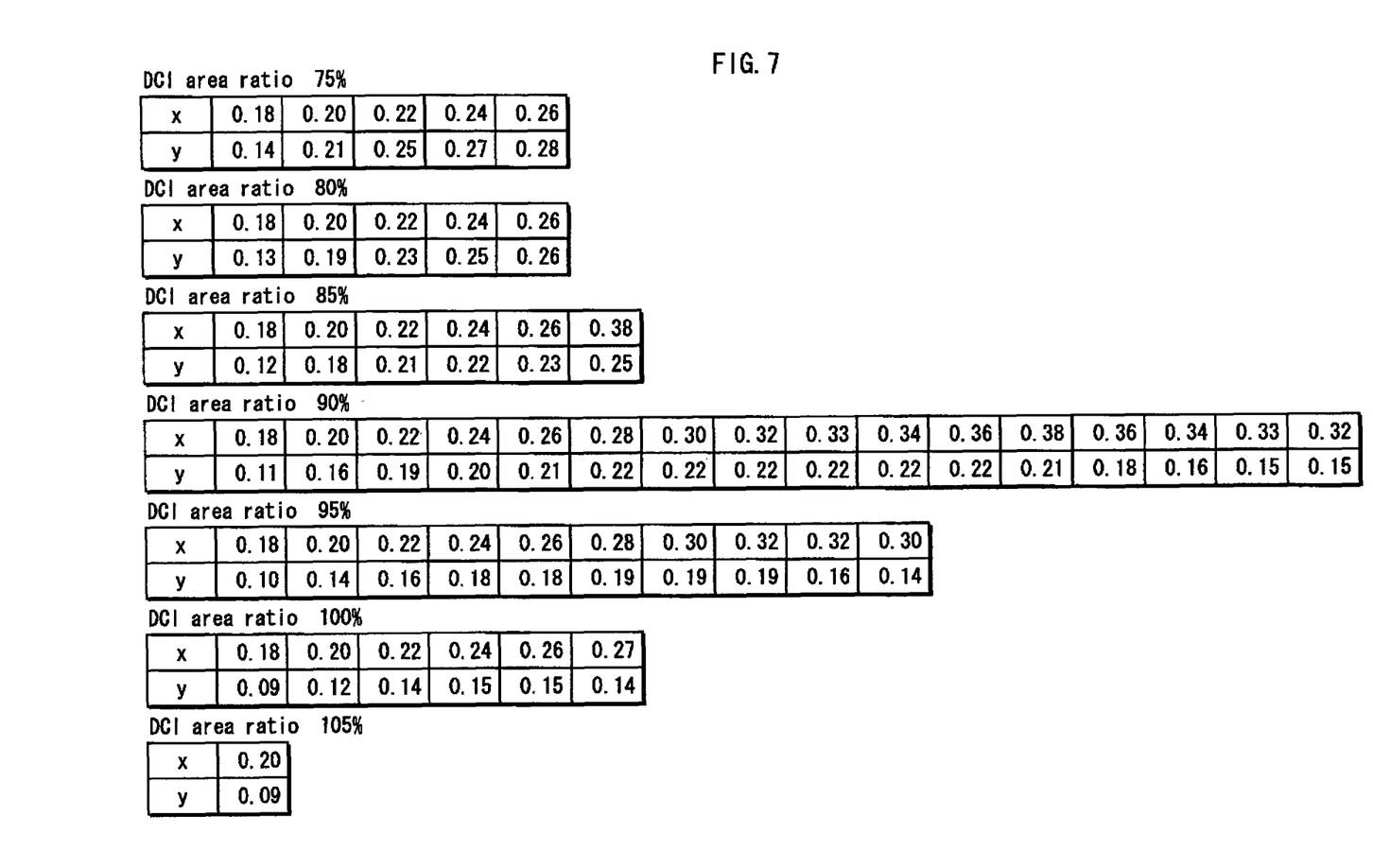
FIG. 7 shows data of position on the CIE chromaticity diagram for each DCI area ratio.

In the present embodiment, the DCI area ratio is adopted as the index value of the color reproducibility of the display apparatus. The DCI area ratio represents an area ratio of an area for which the display apparatus can actually perform color representation to an area of the "DCI" shown in FIG. 6. Accordingly, the higher the DCI area ratio is, the more excellent the color reproducibility of the display apparatus is. As a result of researches, the present inventors found that the DCI area ratio varies in accordance with variation of the chromaticity of the light source. In FIG. 6, a curved line representing each of "75%" to "105%" indicates a DCI area ratio calculated on the u'v' chromaticity coordinates. FIG. 7 shows data necessary for drawing these curved lines. According to the curved lines shown in FIG. 6, it is found that the more closely the chromaticity of the light source approximates to blue color, the better the color reproducibility of the display apparatus improves. It is impossible to derive this finding from conventional technical common sense. In order to improve the color reproducibility of the display apparatus based on the conventional technical common sense, it is considered to be desirable to adjust the chromaticity of the light source so as to be within the white region.

In the present embodiment, the chromaticity of the light source falls within a range surrounded by straight dotted lines L1, L2, L3, and L4 shown in FIG. 6. The straight dotted line L1 represents a border line for the above relational expression (2). The straight dotted line L2 represents a border line for the above relational expression (3). The straight dotted lines L3 and L4 each represent a border line for the above relational expression (1). The chromaticity of the light source is adjusted so as to fall within a range defined by the straight dotted line L1 ($y=0.26$) or less. Accordingly, it is possible to adjust the DCI area ratio of the display apparatus so as to be approximately 80% or higher. It is more preferable that the upper limit of the value y of the chromaticity of the light source is defined by a curved line with the DCI ratio of 85%.

In consideration of only the DCI area ratio, it is desirable to set the value y of the chromaticity of the light source as small as possible. However, if the value y is set to small, the light extraction efficiency decreases. Accordingly, it is impossible to set the value y to small to a great extent. In view of both the above matters in the present embodiment, the lower limit of the value y is set to the straight dotted line L4 ($y=0.09$). It is more preferable that the lower limit of the value y is approximately 0.15.

Also, the straight dotted line L1 represents the boarder in which the peak intensity of green light can be suppressed to twice or less than the peak intensity of red light in the light emission spectrum of the light source. If the value x of the chromaticity of the light source is smaller than a value represented by the straight dotted line L1, the light emission intensity of green light is too high with respect to the light emission intensity of red light. As a result, the display apparatus becomes increasingly used in a state where the transmissivity of the liquid crystal layer is low with respect to green pixels. This decreases the light extraction efficiency as a whole. In the present embodiment, it is possible to suppress the peak intensity of green light twice or less than the peak intensity of red light. This can suppress the decrease of the light extraction efficiency.

On the other hand, the straight dotted line L2 represents the boarder in which the peak intensity of red light can be suppressed to twice or less than the peak intensity of green light in the light emission spectrum of the light source. If the value x of the chromaticity of the light source is greater than a value represented by the straight line L2, the light emission intensity of red light is too high with respect to the light emission intensity of green light. As a result, the display apparatus becomes increasingly used in a state where the transmissivity of the liquid crystal layer is low with respect to red pixels. This decreases the light extraction efficiency as a whole. Furthermore, in such a case, conversion becomes increasingly performed from blue light, which originally has a low light emission efficiency, to red light. This decreases the light emission efficiency of the light source itself, and as a result further decreases the light extraction efficiency. In the present embodiment, it is possible to suppress the peak intensity of red light to twice or less than the peak intensity of green light. This can suppress the decrease of the light extraction efficiency.

Figure 8:
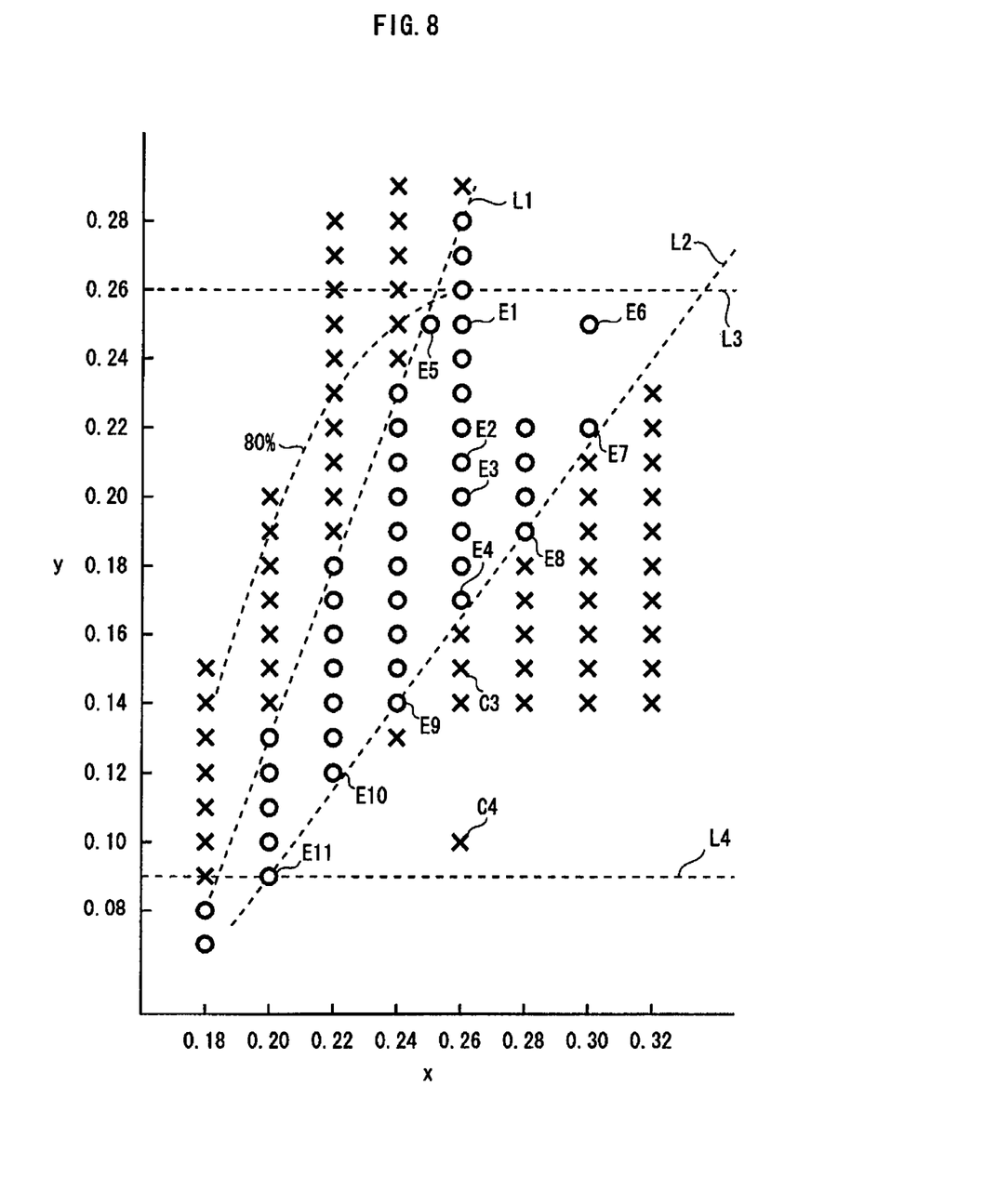
FIG. 8 shows simulations results.

The above straight dotted lines L1 and L2 are obtained by simulation results shown in FIG. 8. FIG. 8 is a plot graph of simulation results of the light emission spectrum of the light source with respect to each chromaticity. In FIG. 8, a sign "o" represents data satisfying a condition that green light has a peak intensity twice or less than red light has and a condition that red light has a peak intensity twice or less than green light has. A sign "x" represents data satisfying a condition that green light has a peak intensity more than twice red light has or a condition that the red light has a peak intensity more than twice the green light has. The straight dotted lines L1 and L2 each pass through the sign "o" at the border between the signs "o" and "x". The above relational expressions (2) and (3) are obtained in this way.

Also, in the present embodiment, the chromaticity of the light source falls within the range surrounded by the straight dotted lines L1, L2, L3, and L4. Alternatively, the chromaticity may be further limited to fall within a range surrounded by the straight dotted lines L5, L2, and L3. As a result, it is possible to set a color gamut reproducible by the display apparatus to a range, which has been unreproducible based on conventional art, and furthermore to increase the color gamut.

As described above, in the present embodiment, it is possible to suppress the decrease of the light extraction efficiency. It is more preferable that the peak intensity of green light falls within a range of plus or minus of 30% of the peak intensity of red light.

Then, the range of blue/green peak ratio is considered with reference to FIG. 5 and FIG. 8. According to FIG. 5, in the case where the value x of the chromaticity is a fixed value in the Examples 1, 2, 3, and 4, the smaller the value y is, the higher the blue/green peak ratio is. This is because as the value y decreases, the chromaticity approximates blue color, and as a result the blue/green peak ratio increases in the light emission spectrum. Accordingly, the highest blue/green peak ratio is obtained in the Example 11 among the Examples in the present embodiment. The blue/green peak ratio obtained in the Example 11 is "19", as shown in FIG. 5. On the contrary, the lowest blue/green peak ratio is obtained in the Examples 1, 5, and 6 among the Examples in the present embodiment. The blue/green peak ratios in the Examples 1, 5, and 6 are "3.0", "3.0", and "3.3", respectively. Accordingly, the blue/green peak ratio relating to the present embodiment falls within a range of 3 to 19. As long as the blue/green peak ratio falls within this range, the DCI area ratio is 80% or higher. Furthermore, it is possible to suppress the decrease of the light extraction efficiency.

<Study>

The following describes reasons why the color reproducibility of the display apparatus is improved by increasing the blue/green peak ratio in the light source (approximation of the chromaticity of the light source to blue).

Figure 9A:
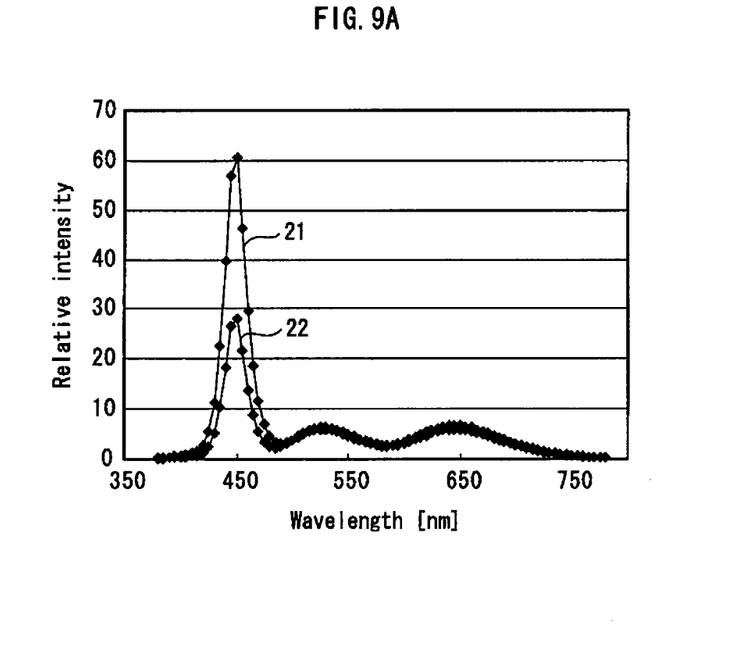
FIGS. 9A and 9B show improvement of color reproducibility of the display apparatus by increasing the peak intensity of green light to the peak intensity of blue light (peak ratio) of the light source.
Figure 9B:
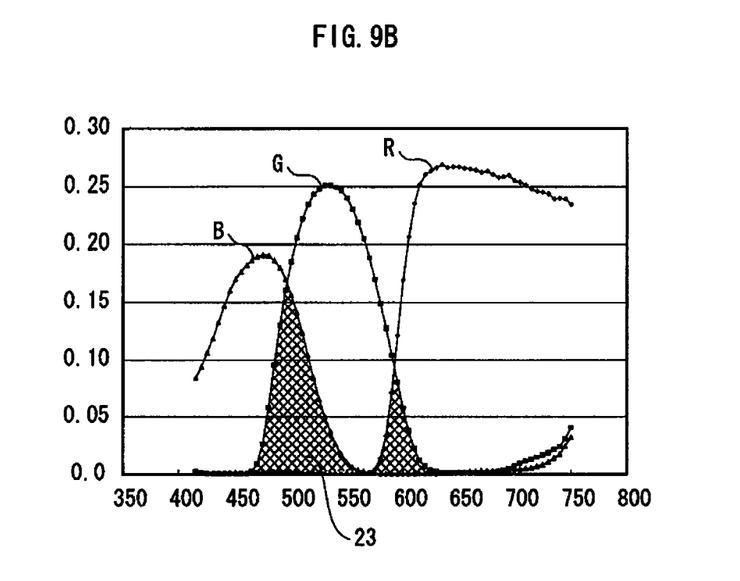
Figure 10A:
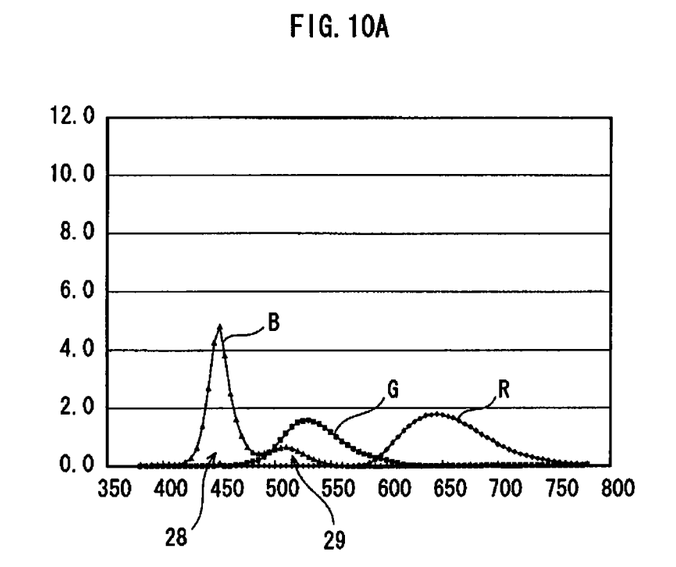
FIGS. 10A and 10B show improvement of the color reproducibility of the display apparatus by increasing the peak intensity of green light to the peak intensity of blue light (peak ratio) of the light source.
Figure 10B:
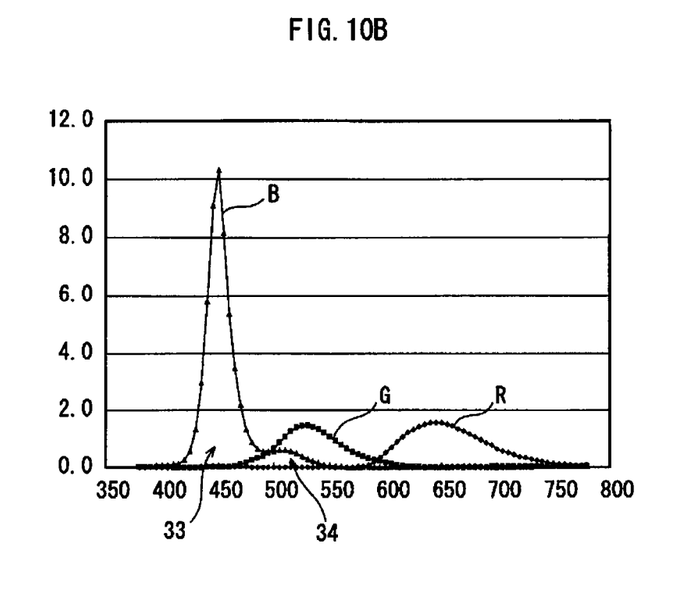

FIGS. 9A, 9B and 10A, and 10B each describe the increase of the blue/green peak ratio in the light source improves the color reproducibility of the display apparatus. FIG. 9A shows a light emission spectrum of a light source relating to each of Examples 21 and 22. FIG. 9B shows a transmission spectrum of the color filter. FIG. 10A shows a spectrum of light emitted from each of color pixels in the case where the light source relating to the Example 22 is adopted. FIG. 10B shows a spectrum of light emitted from each of color pixels in the case where the light source relating to the Example 21 is adopted.

As shown in FIG. 9A, comparison of the Examples 21 and 22 proves that the blue/green peak ratio relating to the Example 21 is higher than the blue/green peak ratio relating to the Example 22.

According to the transmission spectrum of the color filter shown in FIG. 9B, an overlap region 23 between blue light and green light is comparatively large, and accordingly the blue color filter transmits part of green light in addition to blue light.

Accordingly, as shown in FIG. 10A, light emitted from blue pixels includes green components 29 in addition to pure blue components 28. As high the ratio of the green components 29 to the blue components 28 is, the more closely to green light the chromaticity of light emitted from the blue pixels approximates to. As a result, the DCI area ratio decreases.

FIG. 10A is compared with FIG. 10B. According to FIG. 10A, the ratio of the green components 34 to the blue components 33 is comparatively high. On the contrary, according to FIG. 10B, the ratio of the green components 29 to the blue components 28 is comparatively low.

In this way, by increasing the blue/green peak ratio of the light source, it is possible to increase the DCI area ratio, thereby improving the color reproducibility of the display apparatus.

Note that, in conventional cold cathode fluorescent lamps, the above phenomenon where green components mix into light emitted from blue pixels has not been particularly acknowledged as a problem. This is because of the following. According to a light emission spectrum of a cold cathode fluorescent lamp, blue light and green light each have a narrow half width of a peak. Accordingly, it is unlikely to occur such a problem of mixing of green components even if the overlapping region 23 between blue light and green light is comparatively large in the transmission spectrum of the color filter. Compared with this, according to a light source that is composed of a combination of a blue LED, a green light emitting phosphor, and a red light emitting phosphor, blue light and green light each have a comparative large half width of a peak, and accordingly it is likely to occur the problem of mixing of green components.

Figure 11:
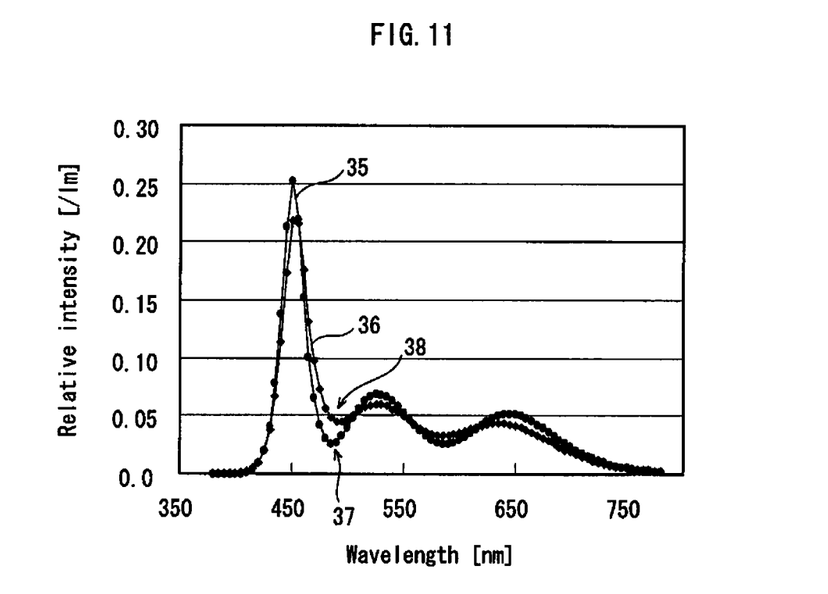

Furthermore, as a result of researches performed by the present inventors, it is found that actual measurement results of a light emission spectrum of such a light source differ from simulation results of those with a particular trend. The particular trend specifically means that a valley between a peak of blue light and a peak of green light in the actual measurement results is slightly shallower than that in the simulation results. FIG. 11 shows, with respect to a light source having the same specification, a light emission spectrum 35 obtained by simulation and a light emission spectrum 36 by actual measurement. As shown in FIG. 11, while a valley 37 between the peaks is deep in the simulation, a valley 38 between the peaks is shallow in the actual measurement. As a result, when a product is actually manufactured, there is observed a phenomenon where green components mix into light emitted from green pixels at a degree greater than expected.

Furthermore, the present inventors found that a valley between a peak of green light and a peak of red light tends to be shallower than expected and as a result a dominant wavelength of each color light tends to vary. The above trends occur because a green light emitting phosphor and a red light emitting phosphor, which are excited by blue light emitting device, each have in principle an absorption band in a visible light band.

In conventional attempt at optimization of spectral distribution by only performing simulations, these trends have been overlooked as simulation errors. With the finding of these trends, the present invention aims to correct the trends to realize a more preferable display apparatus.

For these above reasons, according to the present embodiment, the optimal range of the chromaticity of the light source falls within a range outside of the white region. This optimal range is underivable from the conventional technical common sense.

<Measurement Method>

By measuring the spectral distribution of an LED light source or a backlight apparatus into which the LED light source is embedded, it is possible to calculate the spectral distribution and the chromaticity of transmitted light of a liquid crystal display apparatus is calculated based on a result of the measurement and the spectral transmissivity (which is known) of the liquid display apparatus. The spectral distribution can be measured using a spectrophotometer. As such a spectrophotometer, the MPCD product series manufactured by Otsuka Electronics Co., Ltd. (such as MCPD-2000) may be employed. Alternatively, another measurement instrument may be employed as long as the measurement precision equivalent to that of the MPCD product series is exhibited. It is desirable that measurement is performed while an LED light source is lighted under the rated condition or the use condition of the liquid crystal display apparatus.

Although the present invention has been described based on the embodiment, the present invention is not limited to this embodiment. The present invention includes the following modification examples, for example.

(1) In the above embodiment, a direct-below type backlight apparatus is disclosed. Alternatively, an edge-light type backlight apparatus may be employed in the present invention.

(2) In the above embodiment, the light emission spectrum is analyzed in units of 5 [nm]. Accordingly, the blue/green peak ratio is represented as a numerical value based on the analysis of the light emission spectrum in units of 5 [nm]. Suppose a case where the light emission spectrum is analyzed in units of less than 5 [nm]. In such a case, it is predicted that a peak intensity of blue light is higher than that in the embodiment while a peak intensity of green light is not much different from that in the embodiment. Accordingly, even if analysis is performed with respect to a light source having the same specification, the blue/green peak ratio might vary depending on the accuracy of analysis. In view of this, it is again noted that the blue/green peak ratio in the embodiment is represented as a numerical value based on the analysis of the light emission spectrum in units of 5 [nm].

(3) In the embodiment, an LED is used as a blue light emitting device. Alternatively, an inorganic EL or an organic EL may be employed.

(4) In the embodiment, the green light emitting phosphor has a half width of a light emitting spectrum in a range of 50 [nm] to 100 [nm]. As a host material for phosphor for preferably realizing this green light emitting phosphor, nitride and silicate materials are currently used. In order to preferably increase the color gamut and maintain the light emitting efficiency, the host material for phosphor has a half width of a light emitting spectrum in a range of 50 [nm] to 80 [nm]. Theoretically, as long as the lower limit of the half width is equal to or greater than a half width (approximately 30 [nm]) of an LED having the similar peak wavelength, the effect of the invention is exhibited. This is because it is currently difficult to decrease the half width of the nitride phosphor and the half width of the silicate phosphor than a half width of an LED having the similar peak wavelength, and also maintain the light emitting efficiency.

Although a garnet material may be used as a host material for green light emitting phosphor, this material tends to cause the increase of a half width.

Furthermore, by selecting a material in which a half width at a wavelength is shorter than a peak wavelength that is smaller than a half width at a wavelength that is longer than the peak wavelength, it is possible to emphasize a valley between blue light and green light in a spectrum to increase the color gamut.

(5) In the embodiment, the red light emitting phosphor has a half width of a light emitting spectrum in a range of 50 [nm] to 100 [nm]. As a host material for phosphor for preferably realizing this red light emitting phosphor, a nitride material is currently used. In order to preferably increase the color gamut and maintain the light emitting efficiency, the host material for phosphor needs to have a half width of a light emitting spectrum in a range of 70 [nm] to 100 [nm]. Theoretically, when the upper limit of the half width exceeds this range, light emission at a visible range wavelength increases, and as a result the light emission efficiency decreases.

By selecting a phosphor in which a half width at a wavelength that is shorter than a peak wavelength is smaller than a half width at a wavelength that is longer than the peak wavelength, it is possible to emphasize a valley between green light and red light in a light emission spectrum to increase the color gamut.

(6) In the embodiment, the description has been provided with use of an example of a liquid crystal display apparatus that is composed of a combination of a liquid crystal panel apparatus and a backlight apparatus. Alternatively, the present invention is applicable to a video projection apparatus that is composed of a combination of a liquid crystal panel apparatus and a backlight apparatus. In this case, it is possible to exhibit the effect similar with the case of the liquid crystal display apparatus.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A backlight apparatus having a housing and a light source, comprising:
    the light source housed in the housing including;
    a blue light emitting device that emits blue light;
    a green light emitting phosphor that absorbs part of the blue light to emit green light; and
    a red light emitting phosphor that absorbs at east one of part of the blue light and part of the green light to emit red light, wherein
    chromaticity (x,y) of the light source on a CIE chromaticity diagram satisfies:

$0.09 \leq y \leq 0.26$;

$y \leq 2.5x - 0.37$; and $y \geq 1.25x - 0.16$.

2. The backlight apparatus of claim 1, wherein the chromaticity (x,y) of the light source on the CIE chromaticity diagram satisfies:

$y < 1.594x - 0.230$.

3. The backlight apparatus of claim 1, wherein
    the peak intensity of the light emitting spectrum of the green light emitting phosphor falls within a range of plus or minus 30% of the peak intensity of the light emitting spectrum of the red light emitting phosphor.

4. The backlight apparatus of claim 1, wherein
    the blue light emitting device has a peak wavelength of the light emitting spectrum in a range of 450 nm to 460 nm, and has a half width of a peak in a range of 15 mm to 30 nm,
    the green light emitting phosphor has a peak wavelength of the light, emitting spectrum in a range of 520 nm to 545 nm, and has a half width of a peak in a range of 50 nm to 100 nm, and
    the red light emitting phosphor has a peak wavelength of the light emitting spectrum in a range of 620 nm to 660 nm, and has a half width of a peak in a range of 50 nm to 100 nm.

5. A light source for a backlight apparatus, comprising:
    a blue light emitting device that emits blue light;
    a green light emitting phosphor that absorbs part of the blue light to emit green light; and
    a red light emitting phosphor that absorbs at least one of part of the blue light and part of the green light to emit red light, wherein
    chromaticity (x,y) of the light source on a CIE chromaticity diagram satisfies:

$0.09 \leq y \leq 0.26$;

$y \leq 2.5x - 0.37$; and $y \geq 1.25x - 0.16$.

6. The light source of claim 5, wherein
    the peak intensity of the light emitting spectrum of the green light emitting phosphor falls within a range of plus or minus 30% of the peak. intensity of the light emitting spectrum of the red light emitting phosphor.

7. The light source of claim 5, wherein
    the blue light emitting device has a peak wavelength of the light emitting spectrum in a range of 450 nm to 460 nm, and has a half width of a peak in a range of 15 nm to 30 nm,
    the green light emitting phosphor has a peak wavelength of the light emitting spectrum in a range of 520 nm to 545 nm, and has a half width of a peak in a range of 50 nm to 100 nm, and
    the red light emitting phosphor has a peak wavelength of the light emitting spectrum in a range of 620 nm to 660 nm, and has a half width of a peak in a range of 50 nm to 100 nm.

8. A display apparatus comprising a liquid crystal panel and a backlight apparatus provided on a back side of the liquid crystal panel,
    the backlight apparatus having a housing and a light source housed in the housing,
    the light source comprising:
    a blue light emitting device that emits blue light;
    a green light emitting phosphor that absorbs part of the blue light to emit green light; and
    a red light emitting phosphor that absorbs at least one of part of the blue light and part of the green light to emit red light, wherein chromaticity (x,y) of the light source on a CIE chromaticity diagram satisfies:

$0.09 \leq y \leq 0.26$;

$y \leq 2.5x - 0.37$; and $y \leq 1.25x - 0.16$.

9. The backlight apparatus of claim 1, wherein
    the blue light emitting device has a peak intensity of a light emitting spectrum 3 to 19 times as high as the green light emitting phosphor.

10. The backlight apparatus of claim 1, wherein
    the red light emitting phosphor has the peak intensity of the light emitting spectrum higher than the green light emitting phosphor.

11. The light source of claim 5, wherein Chromaticity (x,y) of the light source on a CIE chromaticity diagram satisfies:

$y \leq 1.594x - 0.230$.

12. The light source of claim 5, wherein
the red light emitting phosphor has the peak intensity of the light emitting spectrum higher than the green light emitting phosphor.

13. The light source of claim 5, wherein
the blue light emitting device has a peak intensity of a light emitting spectrum 3 to 19 times as high as the green light emitting phosphor.

\* \* \* \* \*